(12) United States Patent
Wang et al.

(10) Patent No.: US 9,165,799 B2
(45) Date of Patent: Oct. 20, 2015

(54) SUBSTRATE PROCESSING METHOD AND SUBSTRATE PROCESSING UNIT

(75) Inventors: Xinming Wang, Tokyo (JP); Mitsuru Miyazaki, Tokyo (JP); Kunimasa Matsushita, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 98 days.

(21) Appl. No.: 13/455,529

(22) Filed: Apr. 25, 2012

(65) Prior Publication Data

US 2012/0318304 A1     Dec. 20, 2012

(30) Foreign Application Priority Data

Jun. 16, 2011   (JP) .................................. 2011-133842

(51) Int. Cl.
*H01L 21/02*     (2006.01)
*B08B 3/02*      (2006.01)
*H01L 21/67*     (2006.01)

(52) U.S. Cl.
CPC .......... *H01L 21/67051* (2013.01); *B08B 3/024* (2013.01)

(58) Field of Classification Search
CPC ................................................. H01L 21/67051
USPC .......................................................... 134/33
See application file for complete search history.

(56) References Cited

U.S. PATENT DOCUMENTS 6,260,562  B1 *  7/2001  Morinishi et al. .......... 134/57 R
2010/0154826  A1 *  6/2010  Printz .............................. 134/18

FOREIGN PATENT DOCUMENTS

| JP | 56125842 A | * | 10/1981 |
| JP | 11-47700 | | 2/1999 |
| JP | 11-307492 | | 11/1999 |
| JP | 2002-280348 | | 9/2002 |
| JP | 2005-93694 | | 4/2005 |
| JP | 2009-59876 | | 3/2009 |
| JP | 2010-50436 | | 3/2010 |
| JP | 2010-238850 | | 10/2010 |
| WO | 2007/108315 | | 9/2007 |

OTHER PUBLICATIONS

JP H11-047700, Feb. 1999, Ogasawara, Machine Translation.*
English Abstract of JP 56-125842, published Oct. 2, 1981.*

* cited by examiner

*Primary Examiner* — Michael Kornakov
*Assistant Examiner* — Natasha Campbell
(74) *Attorney, Agent, or Firm* — Wenderoth, Lind & Ponack, L.L.P.

(57) ABSTRACT

A substrate processing method includes jetting at least one fluid from a fluid nozzle toward a rotating substrate surface while moving the fluid nozzle from a center toward a periphery of the rotating substrate. The fluid nozzle is moved from the center of the substrate to a predetermined point at a constant initial movement speed. The fluid nozzle is subsequently moved from the predetermined point at a movement speed V(r) which satisfies the following relational expression: $V(r) \times r^\alpha = C$ (constant), where V(r) represents the movement speed of the fluid nozzle when it passes a position corresponding to a position on the substrate surface at a distance "r" from the center of the substrate, and α represents a power index.

21 Claims, 15 Drawing Sheets

SUBSTRATE PROCESSING METHOD AND SUBSTRATE PROCESSING UNIT

CROSS REFERENCE TO RELATED APPLICATIONS

This document claims priority to Japanese Application Number 2011-133842, filed Jun. 16, 2011, the entire contents of which are hereby incorporated by reference.

BACKGROUND OF THE INVENTION

1. Field of the Invention

The present invention relates to a substrate processing method and a substrate processing unit, and more particularly to a substrate processing method and a substrate processing unit which are used to carry out processing, such as cleaning or drying, a surface of a substrate, such as a semiconductor wafer, in a contactless manner.

2. Description of the Related Art

A two-fluid jet (2FJ) cleaning method is known as a cleaning method for cleaning a substrate surface in a contactless manner. This cleaning method involves jetting a high-speed gas containing fine liquid droplets (mist) from a two-fluid nozzle toward a substrate surface and causing the fine liquid droplets to collide against the substrate surface. The cleaning method utilizes a shock wave, generated by the collision of fine liquid droplets against the substrate surface, to remove (clean off) particles, etc. from the substrate surface.

A drying method using an IPA (isopropyl alcohol) vapor is known as a drying method for drying a substrate surface in a contactless manner. This drying method involves blowing a gas containing an IPA vapor from a fluid nozzle toward a gas-liquid interface on a substrate surface. The drying method evaporates and removes a liquid film from the substrate surface by utilizing the gradient of the surface tension of the liquid film present on the substrate surface and the promotion of evaporation of the liquid by the IPA vapor.

In the conventional two-fluid jet cleaning method, it is common practice to jet a mixed fluid from a two-fluid nozzle toward a substrate surface while moving the two-fluid nozzle, mounted at a front end of a swing arm, parallel to the substrate surface at a constant speed by swinging (rotating) the swing arm at a constant angular velocity. Therefore, as the two-fluid nozzle moves toward the periphery of the substrate, the amount of liquid droplets supplied per unit area of the substrate surface gradually decreases, and the density of liquid droplets colliding against the substrate surface decreases, leading to a decreases in the cleaning effect.

In the drying method using an IPA vapor, there are cases where the angular velocity of a swing arm is changed to change the movement speed of a fluid nozzle mounted at the front end of the swing arm. The degree of change of the movement speed of the fluid nozzle is in most cases determined empirically. This sometimes involves discontinuity in the movement speed of the fluid nozzle, which may result in uneven drying of a substrate surface.

In order to reduce variation in the cleaning effect in a substrate surface, a method has been proposed which involves gradually decreasing the movement speed of a fluid nozzle, such as a cleaning nozzle, as distance from the center of the substrate increases (see e.g., Japanese Patent Laid-Open Publication Nos. H11-47700, H11-307492 and 2005-93694).

The proposed method, however, does not take account of the relationship between factors such as processing time (throughput) and the movement speed of a fluid nozzle such as a cleaning nozzle. Thus, it is considered necessary to newly set the movement speed of a fluid nozzle such as a cleaning nozzle in order to shorten the cleaning or drying time and to thereby increase the throughput, for example.

The applicant has proposed a variety of two-fluid jet cleaning methods for cleaning a substrate surface after polishing efficiently with a mixture of a gas and a liquid jetted against the substrate surface, and a variety of drying methods for drying a substrate surface by using an IPA vapor (see e.g., International Publication No. 2007/108315 pamphlet and Japanese Patent Laid-Open Publication Nos. 2010-50436 and 2010-238850).

SUMMARY OF THE INVENTION

The present invention has been made in view of the above situation in the background art. It is therefore an object of the present invention to provide a substrate processing method and a substrate processing unit which can easily and optimally control the movement speed of a fluid nozzle while taking account of the relationship with factors such as processing time (throughput), making it possible to perform processing, such as cleaning or drying, of a substrate surface uniformly over the entire surface.

In order to achieve the above object, the present invention provides a substrate processing method comprising jetting at least one fluid from a fluid nozzle toward a rotating substrate surface while moving the fluid nozzle from a center toward a periphery of the rotating substrate to process the surface. The fluid nozzle is moved from the center of the substrate to a predetermined point at a constant initial movement speed. The fluid nozzle is subsequently moved from the predetermined point at a movement speed V(r) which satisfies the following relational expression:

$$V(r) \times r^\alpha = C \text{ (constant)},$$

where V(r) represents the movement speed of the fluid nozzle when it passes a position corresponding to a position on the substrate surface at a distance "r" from the center of the substrate, and α represents a power index.

In the above relational expression, the power index α is preferably in the range of $0 < \alpha \leq 1$.

The power index α is ideally set at 1 in order to shorten the processing time and increase the throughput. If the power index α exceeds 1 ($\alpha > 1$), the rate of decrease in the movement speed of the fluid nozzle, moving toward a periphery of a substrate, is too large, resulting in a too long processing time. If the power index α is set to zero ($\alpha = 0$), on the other hand, the movement speed of the fluid nozzle, moving toward a periphery of a substrate, is constant. It is therefore preferred that the power index α be in the range of $0 < \alpha \leq 1$.

The power index α may be determined by an allowed processing time necessary for the fluid nozzle to move from a processing start position to a processing end position.

When there is a limit to the processing time (throughput), the power index α, and thus the movement speed V(r) of the fluid nozzle may be determined based on an allowed processing time. This makes it possible to perform processing of a substrate surface uniformly over the entire surface while responding to the request for the processing time.

In a preferred aspect of the present invention, the fluid nozzle is temporarily stopped when the fluid nozzle has reached a position corresponding to the peripheral end of the substrate.

By temporarily stopping the fluid nozzle at a position corresponding to the peripheral end of a substrate while allowing the nozzle to keep jetting the fluid, the peripheral end region of the substrate, which is generally most dirty, can be cleaned more intensively.

The present invention also provides a substrate processing unit comprising a fluid nozzle for jetting at least one fluid, a movement mechanism for moving the fluid nozzle from a center toward a periphery of a rotating substrate, and a control section for controlling the movement mechanism. The movement mechanism moves the fluid nozzle from the center of the substrate to a predetermined point at a constant initial movement speed, and subsequently moves the fluid nozzle from the predetermined point at a movement speed V(r) which satisfies the following relational expression:

$$V(r) \times r^\alpha = C \text{ (constant)},$$

where V(r) represents the movement speed of the fluid nozzle when it passes a position corresponding to a position on the substrate surface at a distance "r" from the center of the substrate, and α represents a power index. The control section determines the power index α and the movement speed V(r) from an input value of the initial movement speed and an input value of an allowed processing time necessary for the fluid nozzle to move from a processing start position to a processing end position.

Upon processing of a substrate, the movement speed V(r) of the fluid nozzle when it passes a position corresponding to a position on the substrate surface at a distance "r" from the center of the substrate can be easily determined by inputting the initial movement speed of the fluid nozzle and an allowed processing time necessary for the fluid nozzle to move from a processing start position to a processing end position.

According to the present invention, the movement speed V(r) of the fluid nozzle when it passes a position corresponding to a position on a substrate surface at a distance "r" from the center of the substrate can be determined by arbitrarily setting the power index α, e.g., based on an intended processing time (throughput). This makes it possible to perform processing of a substrate surface uniformly over the entire surface while responding to the request for the processing time.

DETAILED DESCRIPTION OF THE PREFERRED EMBODIMENTS

Preferred embodiments of the present invention will now be described with reference to the drawings.

Figure 1:
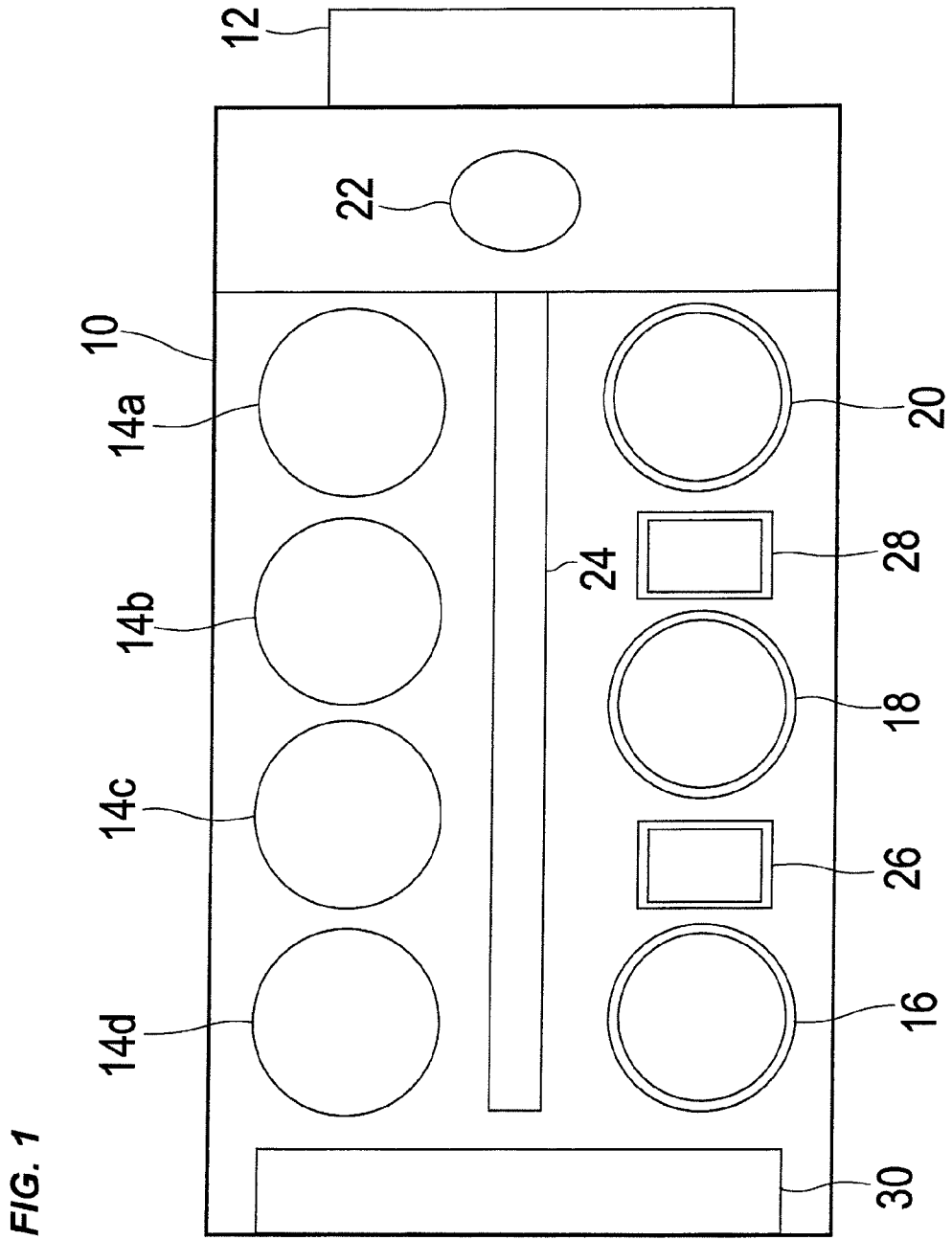
FIG. 1 is a plan view showing the overall construction of a substrate processing apparatus incorporating a substrate processing unit according to an embodiment of the present invention.

FIG. 1 is a plan view showing the overall construction of a substrate processing apparatus incorporating a substrate processing unit according to an embodiment of the present invention. As shown in FIG. 1, this substrate processing apparatus includes a generally-rectangular housing 10, and a loading port 12 for placing thereon a substrate cassette for storing a large number of substrates, such as semiconductor wafers. The loading port 12 is disposed adjacent to the housing 10 and can be mounted with an open cassette, a SMIF (standard manufacturing interface) or a FOUP (front opening unified pod). A SMIF and a FOUP are each an airtight container which houses therein a substrate cassette and which, by covering it with a partition wall, can keep the internal environment independent of the external environment.

In the housing 10 are housed four polishing units 14a-14d, a first cleaning unit 16 and a second cleaning unit 18 each for cleaning a substrate after polishing, and a drying unit 20 for drying a substrate after cleaning. The polishing units 14a-14d are arranged in the longitudinal direction of the substrate processing apparatus, and the cleaning units 16, 18 and the drying unit 20 are also arranged in the longitudinal direction of the substrate processing apparatus. The second cleaning unit 18 and the drying unit 20 are each a substrate processing unit according to the present invention.

A first substrate transport robot 22 is disposed in an area surrounded by the loading port 12, the polishing unit 14a located near the loading port 12, and the drying unit 20. Further, a substrate transport unit 24 is disposed parallel to the polishing units 14a-14d. The first substrate transport robot 22 receives a substrate before polishing from the loading port 12 and transfers the substrate to the substrate transport unit 24, and receives a substrate after drying from the drying unit 20 and returns the substrate to the loading port 12. The substrate transport unit 24 transports a substrate after receiving it from the first substrate transport robot 22, and transfers the substrate between it and one of the polishing units 14a-14d.

Between the first cleaning unit 16 and the second cleaning unit 18 is disposed a second substrate transport robot 26 for transferring a substrate between it and the cleaning units 16, 18. Further, between the second cleaning unit 18 and the drying unit 20 is disposed a third substrate transport robot 28 for transferring a substrate between it and the units 18, 20.

In the housing 10 is also disposed a control section 30 for controlling the operations of the devices of the substrate processing apparatus. For example, as described below, the control section 30 controls the movement of a swing arm 44 provided in the second cleaning unit (substrate processing unit) 18, thereby controlling the movement speed of a fluid nozzle 46.

In this embodiment, the first cleaning unit 16 is a roll cleaning unit which cleans a substrate by rubbing roll cleaning members, which extend longitudinally, against front and back surfaces of the substrate in the presence of a cleaning liquid. This first cleaning unit (roll cleaning unit) 16 is configured to also use megasonic cleaning which involves applying ultrasonic waves at a frequency of about 1 MHz to the cleaning liquid, and causing a force of the cleaning liquid, produced by vibration acceleration, to act on fine particles adhering to a substrate surface.

The second cleaning unit 18 is a substrate processing unit according to the present invention. The drying unit 20 is a spin drying unit which dries a substrate by jetting an IPA vapor from a moving nozzle toward the substrate, and further dries the substrate through centrifugal force by rotating the substrate at a high speed.

It is possible to use a cleaning section consisting of the cleaning units 16, 18 vertically arranged in two stages. Thus, in this case, the cleaning section is comprised of a vertical stack of two substrate processing units.

Figure 2:
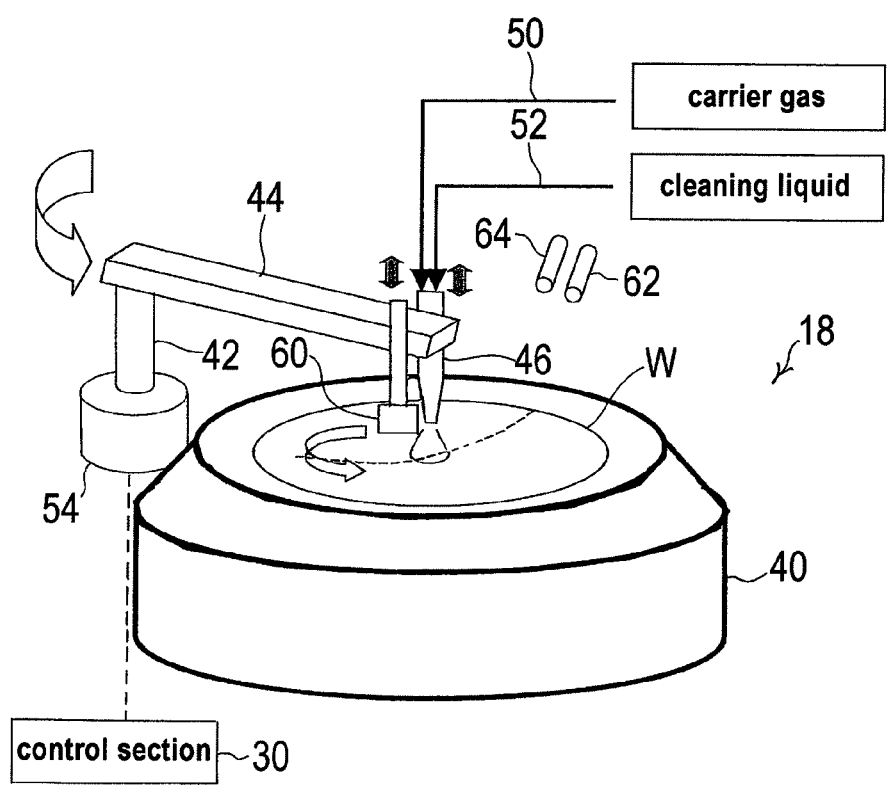
FIG. 2 is a schematic perspective view of the substrate processing unit according to the present invention, which is used as a second cleaning unit in the substrate processing apparatus shown in FIG. 1.
Figure 3:
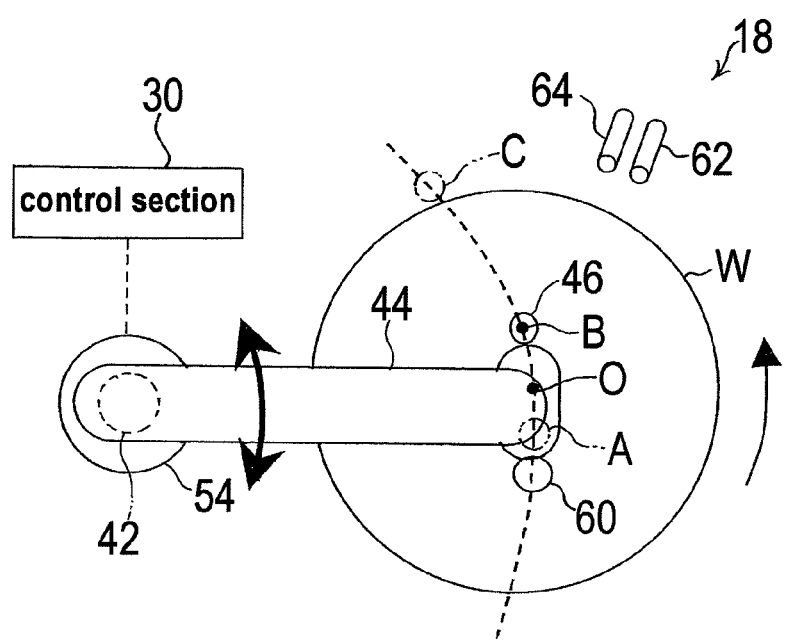
FIG. 3 is a plan view showing the main portion of the substrate processing unit of FIG. 2.

FIG. 2 is a schematic perspective view of the substrate processing unit according to the present invention, which is used as the second cleaning unit 18 shown in FIG. 1; and FIG. 3 is a plan view showing the main portion of the substrate processing unit of FIG. 2.

As shown in FIGS. 2 and 3, the second cleaning unit 18, as the substrate processing unit according to an embodiment of the present invention, includes a cleaning tank 40 which surrounds the circumference of a substrate W, which is held, e.g., by not-shown chucks and rotates, e.g., by the rotation of the chucks, a rotatable support shaft 42 disposed beside the cleaning tank 40, and a horizontally-extending swing arm 44 coupled, at its base end, to an upper end of the support shaft 42. A fluid nozzle (two-fluid nozzle) 46 is vertically movably mounted to a free end (front end) of the swing arm 44.

To the fluid nozzle 46 is connected a carrier gas supply line 50 for supplying a carrier gas, such as $N_2$ gas, and a cleaning liquid supply line 52 for supplying a cleaning liquid, such as pure water or water containing dissolved $CO_2$ gas. A two-fluid jet flow of the carrier gas, containing fine liquid droplets (mist) of the cleaning liquid, is created by jetting from the fluid nozzle 46 a mixture of the carrier gas, such as $N_2$ gas, and the cleaning liquid, such as pure water or water containing dissolved $CO_2$ gas, supplied into the fluid nozzle 46. By allowing the two-fluid jet flow created by the fluid nozzle 46 to collide against a surface of a rotating substrate W, particles, etc. can be removed (cleaned) from the substrate surface by utilizing a shock wave generated by the collision of the fine liquid droplets against the substrate surface.

The support shaft 42 is connected to a motor 54 as a drive mechanism for rotating the support shaft 42, thereby swinging the swing arm 44 on the support shaft 42. The rotational speed of the motor 54 is controlled by a signal from the control section 30, whereby the angular velocity of the swing arm 44 and thus the movement speed of the fluid nozzle 46 are controlled.

In this embodiment, a pencil-type cleaning tool 60, e.g., comprised of a PVA sponge, is rotatably and vertically movably mounted to the front end of the swing arm 44. Further, beside and above the cleaning tank 40 are disposed a rinsing liquid supply nozzle 62 for supplying a rinsing liquid to the surface of the rotating substrate W, held, e.g., by the chucks, and a chemical supply nozzle 64 for supplying a liquid chemical to the substrate surface. In operation, while keeping the lower end of the pencil-type cleaning tool 60 in contact with the surface of the rotating substrate W at a predetermined pressure, the pencil-type cleaning tool 60 is moved by swinging the swing arm 44 and, at the same time, the rinsing liquid or the liquid chemical is supplied to the surface of the substrate W, thereby cleaning the surface of the substrate W. This contact-type cleaning of the surface of the substrate W is optional, and may be carried out as necessary.

As shown in FIG. 3, as the swing arm 44 moves during cleaning of the surface of the substrate W, the fluid nozzle 46 moves along an arc-shaped trajectory from an offset position A to a cleaning end position C lying outside the substrate W, passing a position just above the center O of the substrate W and a position just above a predetermined point B at a predetermined distance from the center O. During this cleaning, a two-fluid jet flow of the carrier gas, containing fine liquid droplets (mist) of the cleaning liquid, is continually jetted from the fluid nozzle 46 toward the surface of the rotating substrate W. FIG. 3 shows the fluid nozzle 46 when it lies at a position just above the predetermined point B.

In this embodiment, the movement speed V(r) of the fluid nozzle 46 when it passes a position corresponding to (just above) a position on the surface of the substrate W, lying at a distance "r" from the center O of the substrate W, is determined such that it satisfies the following relational expression:

$$V(r) \times r^\alpha = C \text{ (constant)},$$

where α represents a power index.

The movement speed of the fluid nozzle 46 thus changes with distance from the center of the substrate W. This makes it possible to make the amount (density) of the fine liquid droplets, supplied from the fluid nozzle 46 to the surface of the substrate W, per unit area of the substrate surface uniform over the entire surface.

When the fluid nozzle 46 is moved at the movement speed V(r), the movement speed V(r=0) is extremely high when the fluid nozzle 46 passes a position corresponding to (just above) the center of a substrate. In this embodiment, therefore, the fluid nozzle 46 is moved from the offset position (cleaning start position) A to a position corresponding to the predetermined point B at a constant initial movement speed, and subsequently moved at the movement speed V(r) which gradually decreases from the initial movement speed.

Thus, the fluid nozzle 46 moves at the movement speed V(r) which is represented by the following equation (1):

$$V_{(r)} = \frac{V_0 b^\alpha}{r^\alpha} \tag{1}$$

where "b" is the distance from the center O of a substrate W to the predetermined point B, and $V_0$ is the initial movement speed of the fluid nozzle 46.

Figure 4:
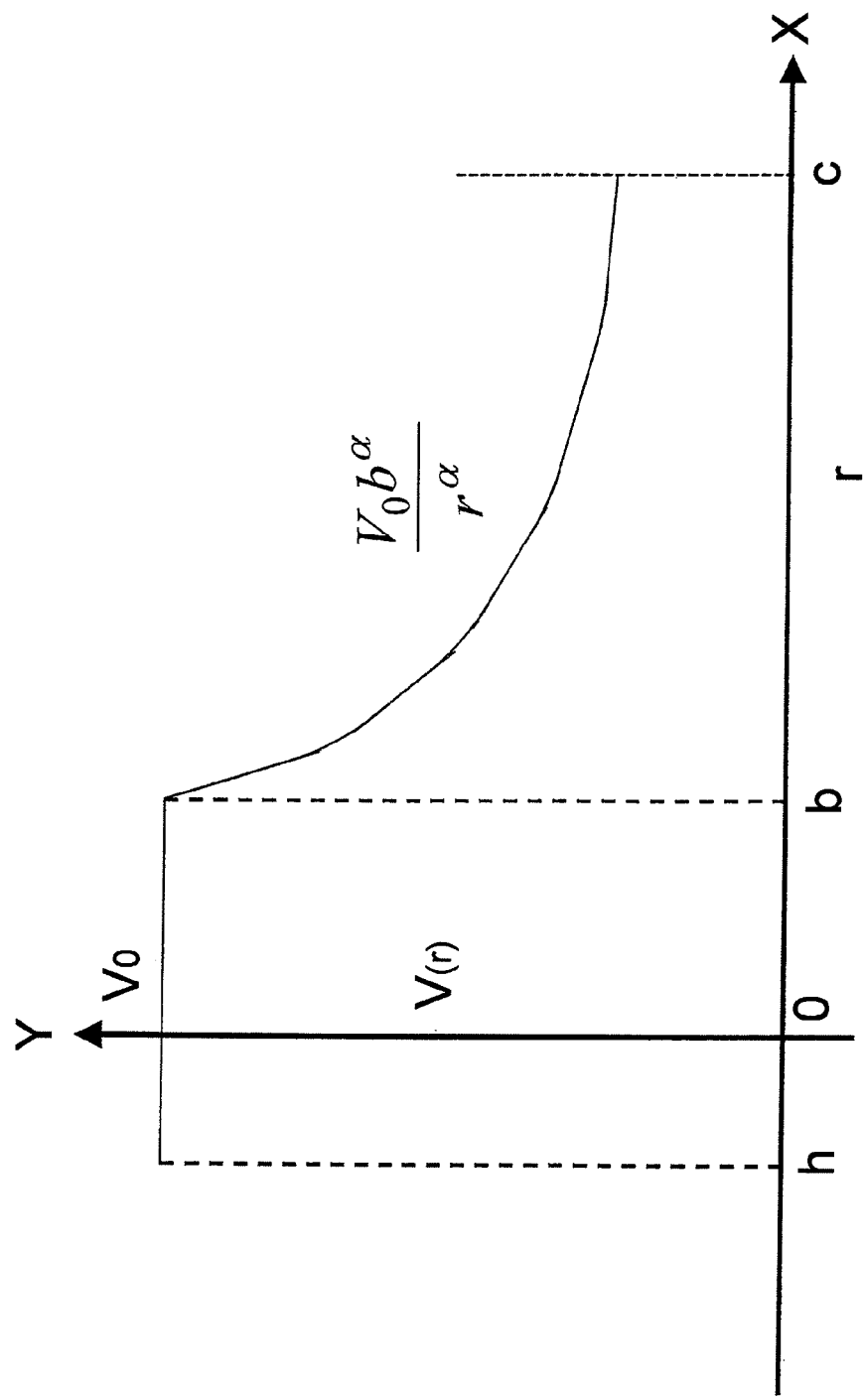
FIG. 4 is a graph showing the relationship between a distance (radius) "r" from a center of a substrate and a movement speed V(r) of a fluid nozzle along the trajectory of the movement of the fluid nozzle, the X-axis representing the distance (radius) "r" and the Y-axis representing the movement speed V(r) of the fluid nozzle.

FIG. 4 shows the relationship between the distance (radius) "r" from the center O of a substrate W and the movement speed V(r) of the fluid nozzle 46 along the trajectory of the movement of the fluid nozzle 46 determined from the above equation (1). The X-axis represents the distance (radius) "r" and the Y-axis represents the movement speed V(r) of the fluid nozzle 46. In FIG. 4, "h" indicates the distance from the center O of the substrate W to the offset position A, "b" represents the distance from the center O of the substrate W to the predetermined point B, and "c" represents the distance from the center O of the substrate W to the cleaning end position C.

According to this embodiment, the movement speed V(r) of the fluid nozzle 46 when it passes a position corresponding to a position on a substrate surface at a distance "r" from the center O of the substrate can be determined by arbitrarily setting the power index α, e.g., based on an intended processing time (throughput). This makes it possible to perform processing of the substrate surface uniformly over the entire surface while responding to the request for the processing time, for example.

The power index α is ideally set at 1 (α=1) in order to shorten the processing time and increase the throughput. If the power index α exceeds 1 (α>1), the rate of decrease in the movement speed of the fluid nozzle 46, moving toward the periphery of a substrate, is too large, resulting in a too long processing time. If the power index α is set to zero (α=0), on the other hand, the movement speed of the fluid nozzle 46, moving toward the periphery of a substrate, is constant. It is therefore preferred that the power index α be in the range of 0<α≤1.

The power index α can be determined, e.g., from the following equations (2) to (4) using, as input parameters, the initial movement speed $V_0$ of the fluid nozzle 46, the distance "h" from the center O of a substrate W to the offset position A, the distance "b" from the center O of the substrate W to the predetermined point B, and an allowed cleaning time "t" necessary for the fluid nozzle 46 to move from the offset position (cleaning start position) A to the cleaning end position C. In the following equations, "$t_b$" is the travel time from the predetermined point B to the cleaning end position C, and "R" is the distance from the center O of the substrate W to the cleaning end position C.

$$t = \frac{h+b}{V_0} + t_b \quad (2)$$

$$t_b = \int_b^R \frac{1}{V_{(r)}} dr \quad (3)$$

$$V_0 = \frac{1}{t}\left[h + b + \frac{1}{(\alpha+1)b^\alpha}(R^{\alpha+1} - b^{\alpha+1})\right] \quad (4)$$

For example, the calculated power index α is 0.75 (α=0.75) when the initial movement speed $V_0$ of the fluid nozzle 46 is set at 30 mm/sec, the distance "h" from the center O of a substrate W to the offset position A is set at 10 mm, the distance "b" from the center O of the substrate W to the predetermined point B is set at 10 mm, and the allowed cleaning time "t" is set at 22 seconds. By thus determining the power index α, the movement speed V(r) of the fluid nozzle 46 can be determined from the above equation (1).

Figure 5:
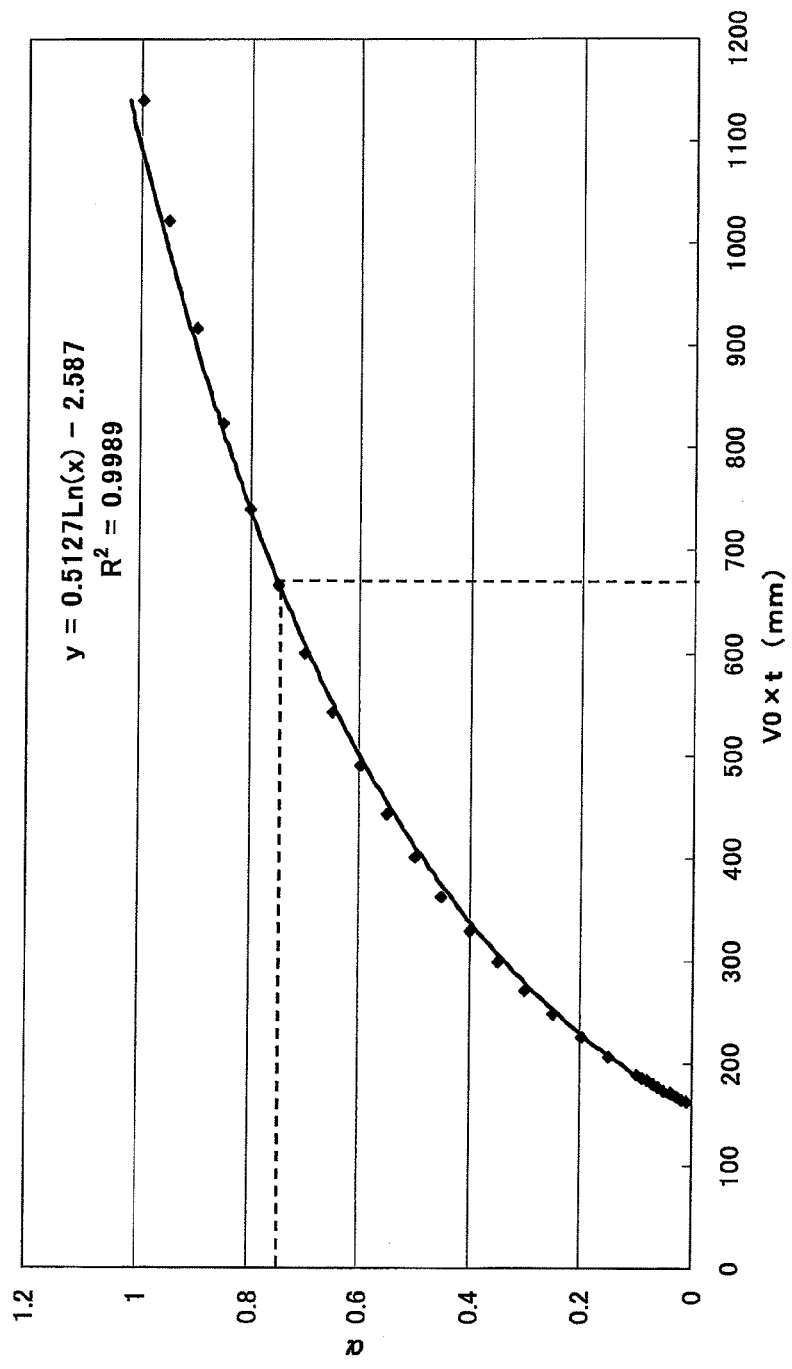
FIG. 5 is a graph showing the relationship between a power index α and the product of an initial movement speed $V_0$ and an allowed cleaning time "t" ($V_0 \times t$)

FIG. 5 shows the relationship between the power index α and the product of the initial movement speed $V_0$ and the allowed cleaning time "t" ($V_0$×t), determined by the equations (2) to (4) when the distance "b" from the center O of a substrate W to the predetermined point B and the distance "h" from the center O of the substrate W to the offset position A are both set at 10 mm. The power index α (=0.75) can be determined from the relationship shown in FIG. 5 based on the product (30×22=660) of the initial movement speed $V_0$ (=30 mm/sec) and the allowed cleaning time t (=22 seconds).

Figure 6:
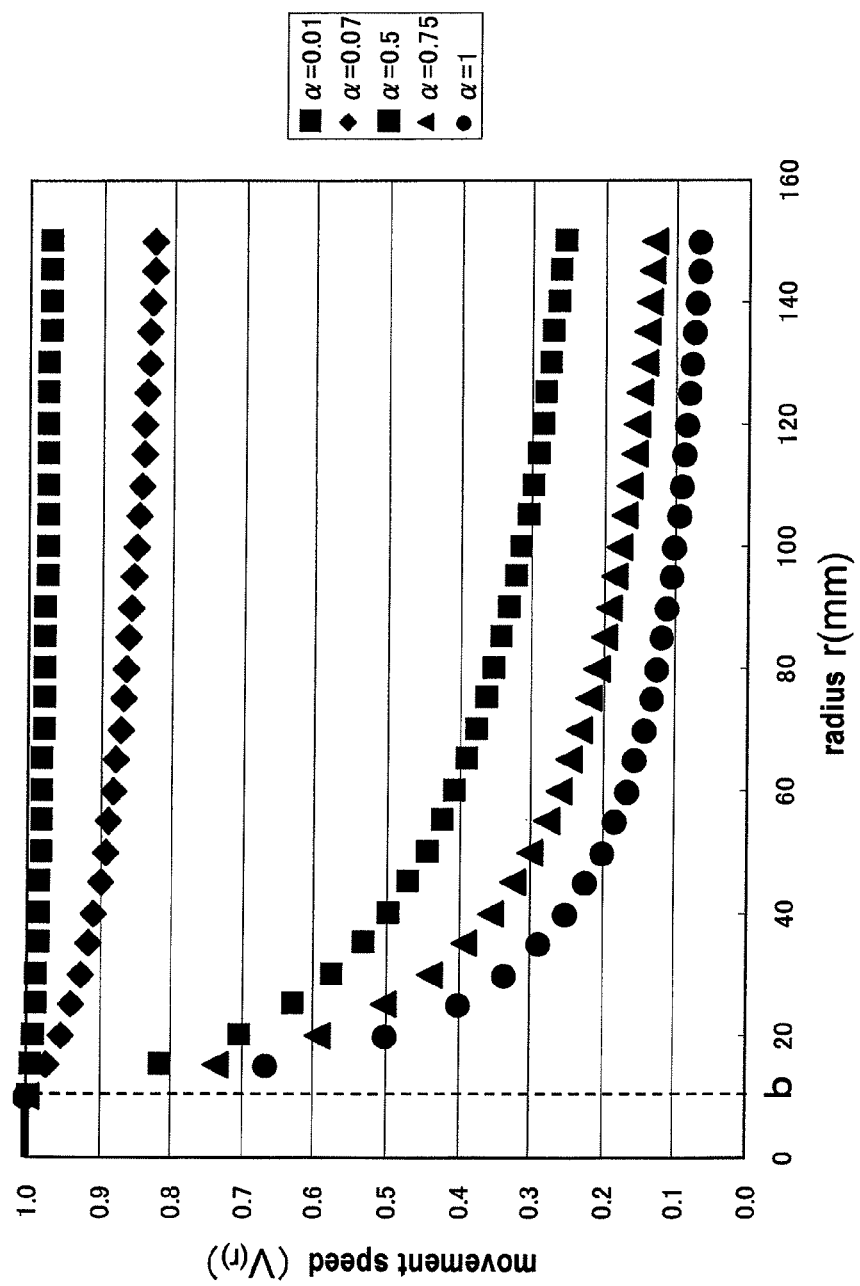
FIG. 6 is a graph showing the relationship between the distance "r" from a center of a substrate and a movement speed V(r) of a fluid nozzle, as determined with varying power indices α.
Figure 7:
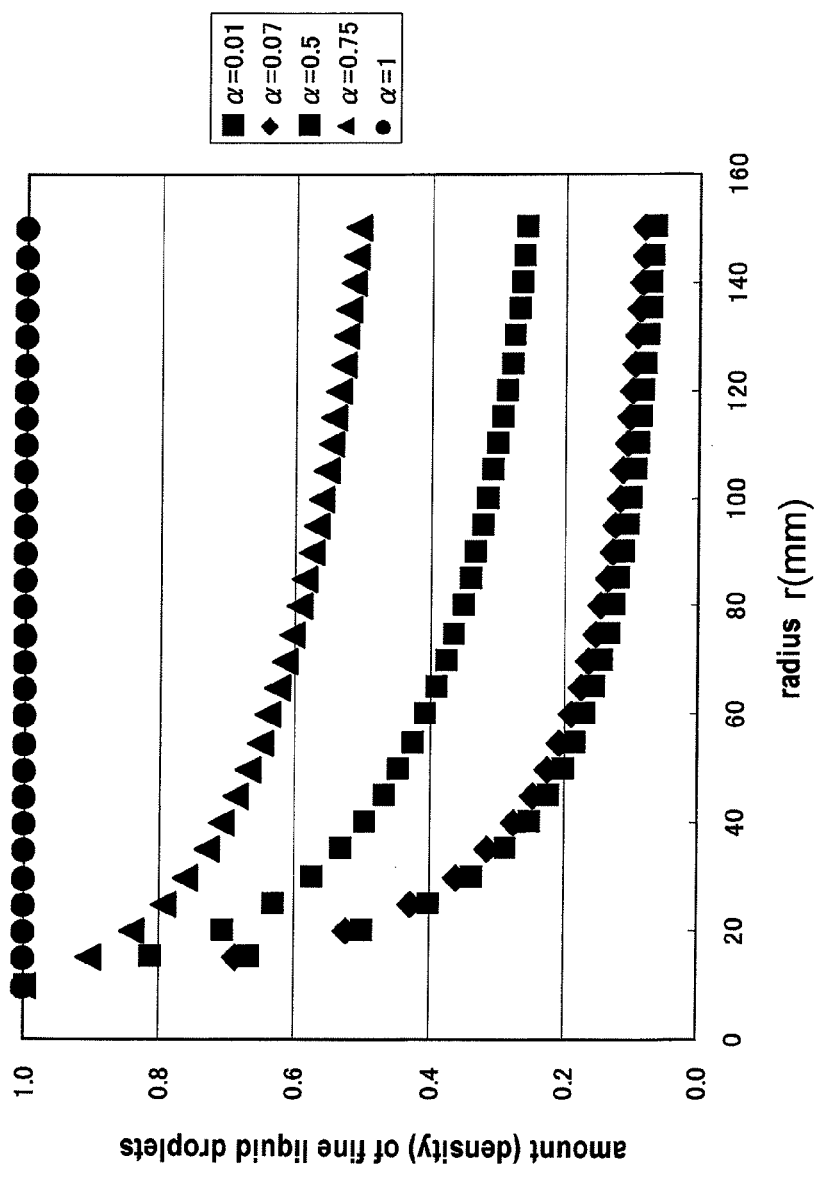
FIG. 7 is a graph showing the relationship between a distance "r" from a center of a substrate and an amount (density) of fine liquid droplets supplied per unit area of a substrate surface, as determined with varying power indices α.

FIG. 6 shows the relationship between the distance "r" from the center O of a substrate W and the movement speed V(r) of the fluid nozzle 46, as determined with varying power indices α when the distance "b" from the center O of the substrate W to the predetermined point B is set at 10 mm. In FIG. 6, the initial movement speed $V_0$ is set at 1 (arbitrary unit). FIG. 7 shows the relationship between the distance "r" from the center O of a substrate W and the amount (density) of fine liquid droplets supplied per unit area of the substrate surface, as determined with varying power indices α when the distance "b" from the center O of the substrate W to the predetermined point B is set at 10 mm. In FIG. 7, the amount (density) of fine liquid droplets supplied at the center of the substrate W is set at 1 (arbitrary unit).

As can be seen in FIGS. 6 and 7, the closer the power index α is to 1, the more uniform is the distribution of the density of fine liquid droplets along the radial direction of the substrate; therefore the processing time "t" should be set as long as possible if the throughput permits.

Figure 8:
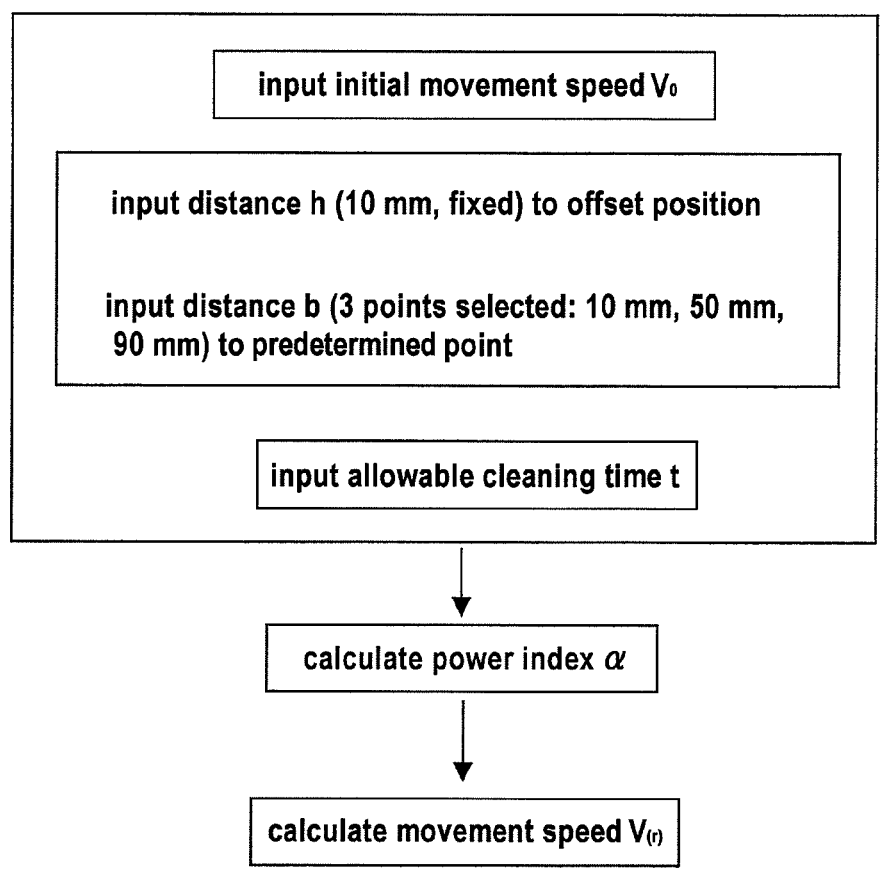
FIG. 8 is a flow chart showing a procedure for determining a power index α and a movement speed V(r) of a fluid nozzle.

In this embodiment, the power index α and the movement speed V(r) of the fluid nozzle 46 are determined by inputting the initial movement speed $V_0$ of the fluid nozzle 46, the distance "h" from the center O of a substrate W to the offset position A, the distance "b" from the center O of the substrate W to the predetermined point B, and the allowed cleaning time "t". The rotational speed of the motor 54 is controlled so that the fluid nozzle 46 moves at the movement speed V(r). FIG. 8 shows a procedure for determining the power index α and the movement speed V(r).

First, the initial movement speed $V_0$ is inputted. Next, the distance "h" from the center of the substrate to the offset position, e.g., 10 mm (fixed), and the distance "b" from the center of the substrate to the predetermined point are inputted. A plurality of points, e.g., three points (10 mm, 50 mm, 90 mm), may be selected and inputted as the distance "b". Next, the allowed cleaning time "t" is inputted. The power index α is calculated from the input values, and the movement speed V(r) of the fluid nozzle 46 is calculated from the calculated power index α.

When there is a limit to the processing time (throughput), the power index α, and thus the movement speed V(r) of the fluid nozzle 46 are thus determined based on the allowed cleaning time "t" necessary for the fluid nozzle 46 to move from the offset position (cleaning start position) A to the cleaning end position C. This makes it possible to perform processing of a substrate surface more uniformly over the entire surface while responding to the request for the processing time.

In the illustrated substrate processing apparatus, a substrate is taken out of a substrate cassette in the loading port 12, and the substrate is transported to one of the polishing units 14a-14d, where a surface of the substrate is polished. The substrate surface after polishing is cleaned in the first cleaning unit (roll cleaning unit) 16, and is then further cleaned in the second cleaning unit (substrate processing unit) 18 using a two-fluid jet flow. When cleaning the substrate surface in the second cleaning unit (substrate processing unit) 18, a two-fluid jet flow is jetted from the fluid nozzle 46 toward the surface of the rotating substrate while moving the fluid nozzle 46 at a controlled speed as described above.

More specifically, after carrying out roll cleaning of a substrate in the first cleaning unit 16, the substrate is carried into the second cleaning unit 18. In the second cleaning unit 18, while rotating the substrate, a rinsing liquid is supplied from the rinsing liquid supply nozzle 62 onto the surface of the substrate to carry out rinsing of the substrate surface for several seconds (e.g., 3 seconds). Subsequently, the pencil-type cleaning tool 60 is allowed to scan across the substrate surface a predetermined times (e.g., two or three times) while jetting a liquid chemical from the chemical supply nozzle 64 toward the substrate surface to carry out pencil cleaning of the substrate surface. Immediately after the pencil cleaning, two-fluid jet cleaning of the substrate surface is started in the same second cleaning unit 18.

The cleaning of the substrate surface using a two-fluid jet flow is carried out by swinging the swing arm 44 a predetermined times (e.g., 1 to 4 times) to move the fluid nozzle 46, jetting a two-fluid jet flow, over the rotating substrate. The angular velocity of the swing arm 44, i.e., the movement speed of the fluid nozzle 46, is calculated based on a permissible processing time and number of scans. The rotating speed of the substrate during the two-fluid jet cleaning of the substrate surface need not necessarily be made equal to the rotating speed of the substrate during the cleaning of the substrate surface by the pencil-type cleaning tool 60.

The fluid nozzle 46 may temporarily be stopped when the fluid nozzle 46 has reached a position corresponding to the peripheral end of the substrate W. By temporarily stopping the fluid nozzle 46 at the position corresponding to the peripheral end of the substrate W while allowing the fluid nozzle 46 to keep jetting the fluid, the peripheral end region of the substrate W, which is generally most dirty, can be cleaned more intensively.

The substrate after cleaning is taken out of the second cleaning unit 18 and carried into the drying unit 20, where the substrate is spin-dried. The substrate after drying is returned to the substrate cassette in the loading port 12.

Figure 9:
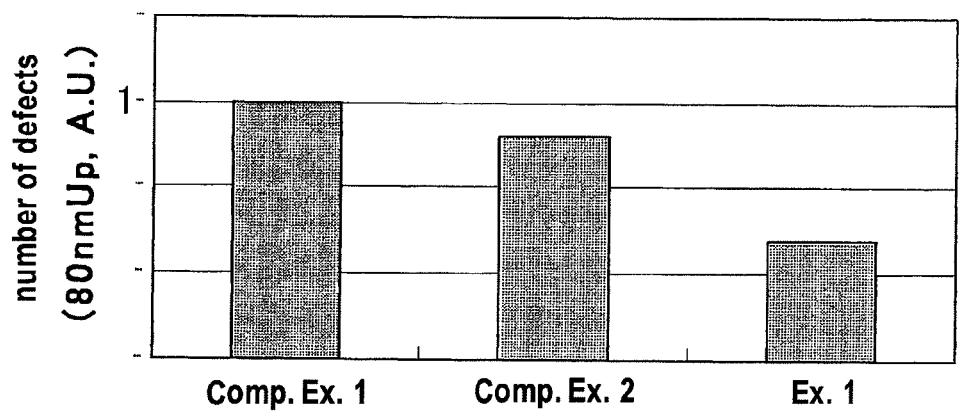
FIG. 9 is a graph showing the number of defects remaining on a substrate surface in Example 1 and Comp. Examples 1 and 2.

Experiments (Example 1 and Comparative Examples 1 and 2) were conducted by using the above-described substrate processing apparatus. In Example 1, a TEOS blanket wafer (substrate) was polished for 60 seconds in one of the polishing units 14a-14d. The substrate surface after polishing was cleaned for 30 seconds in the first cleaning unit (roll cleaning unit) 16, and then further cleaned for 22 seconds in the second cleaning unit (substrate processing unit) 18 while controlling the movement speed of the fluid nozzle 46 in the above-described manner. The substrate after cleaning was spin-dried in the drying unit 20. The substrate after drying was subjected to measurement of the number of particles (defects), having a size of not less than 80 nm, remaining on the substrate surface. In Comparative Example 1, the same substrate (TEOS blanket wafer) was processed in the same manner as in Example 1 except that the substrate was not subjected to two-fluid jet cleaning in the second cleaning unit 18. In Comparative Example 2, the same substrate was processed in the same manner as in Example 1 except that two-fluid jet cleaning of the substrate in the second cleaning unit 18 was carried out while moving the fluid nozzle 46 at a constant speed. For the substrates after drying, obtained in the Comp. Examples, the same measurement of the number of particles was carried out. The results of measurement are shown in FIG. 9.

As will be appreciated from comparison of the data between Example 1 and Comp. Examples 1 and 2 shown FIG. 9, controlling the movement speed of the fluid nozzle 46, jetting a two-fluid jet flow, according to the present invention in the two-fluid jet cleaning can significantly reduce (e.g., about 10% to about 50%) the number of defects remaining on a substrate surface after cleaning.

Figure 10:
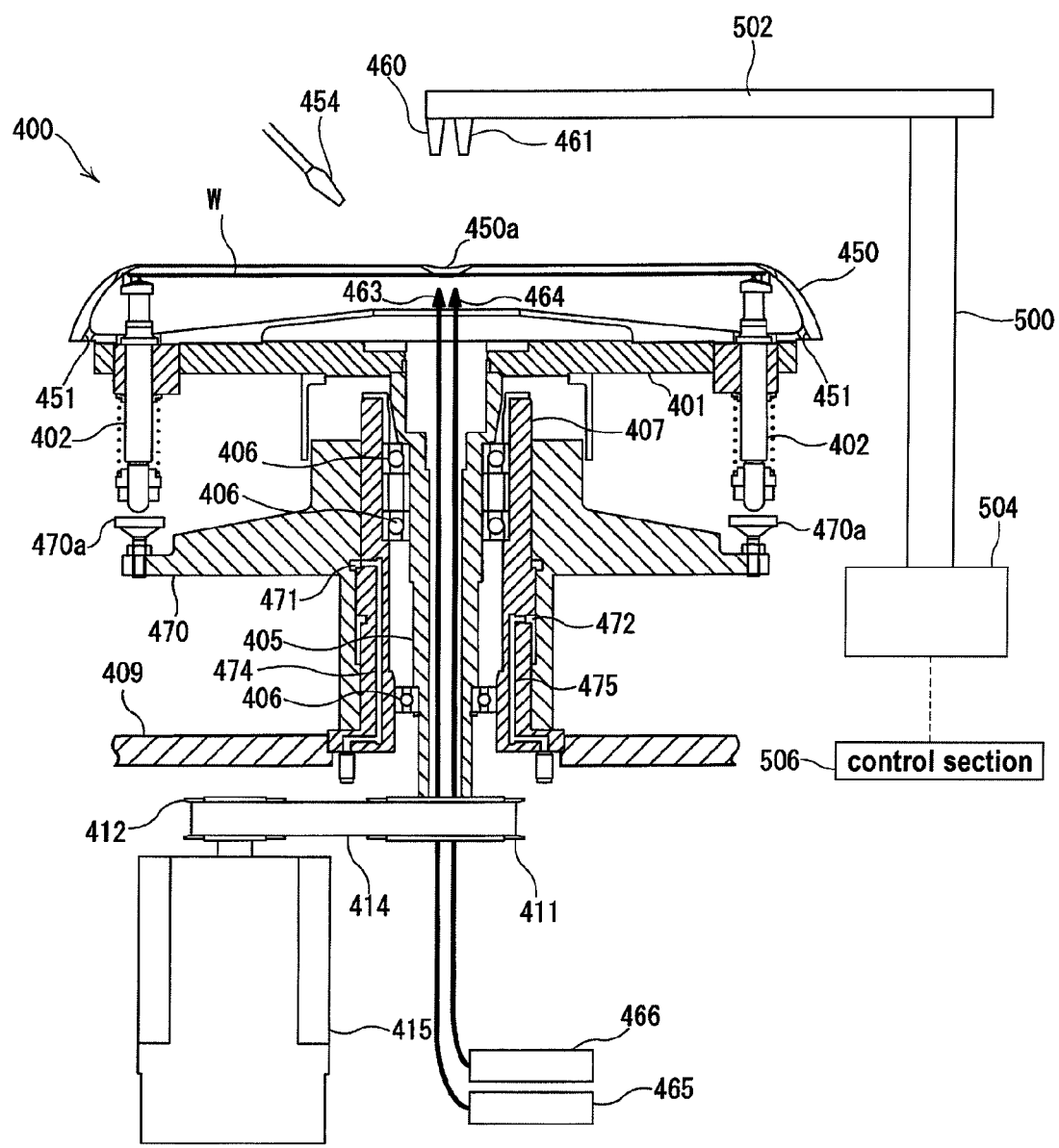
FIG. 10 is a vertical sectional view of a substrate processing unit (drying unit) according to another embodiment of the present invention.
Figure 11:
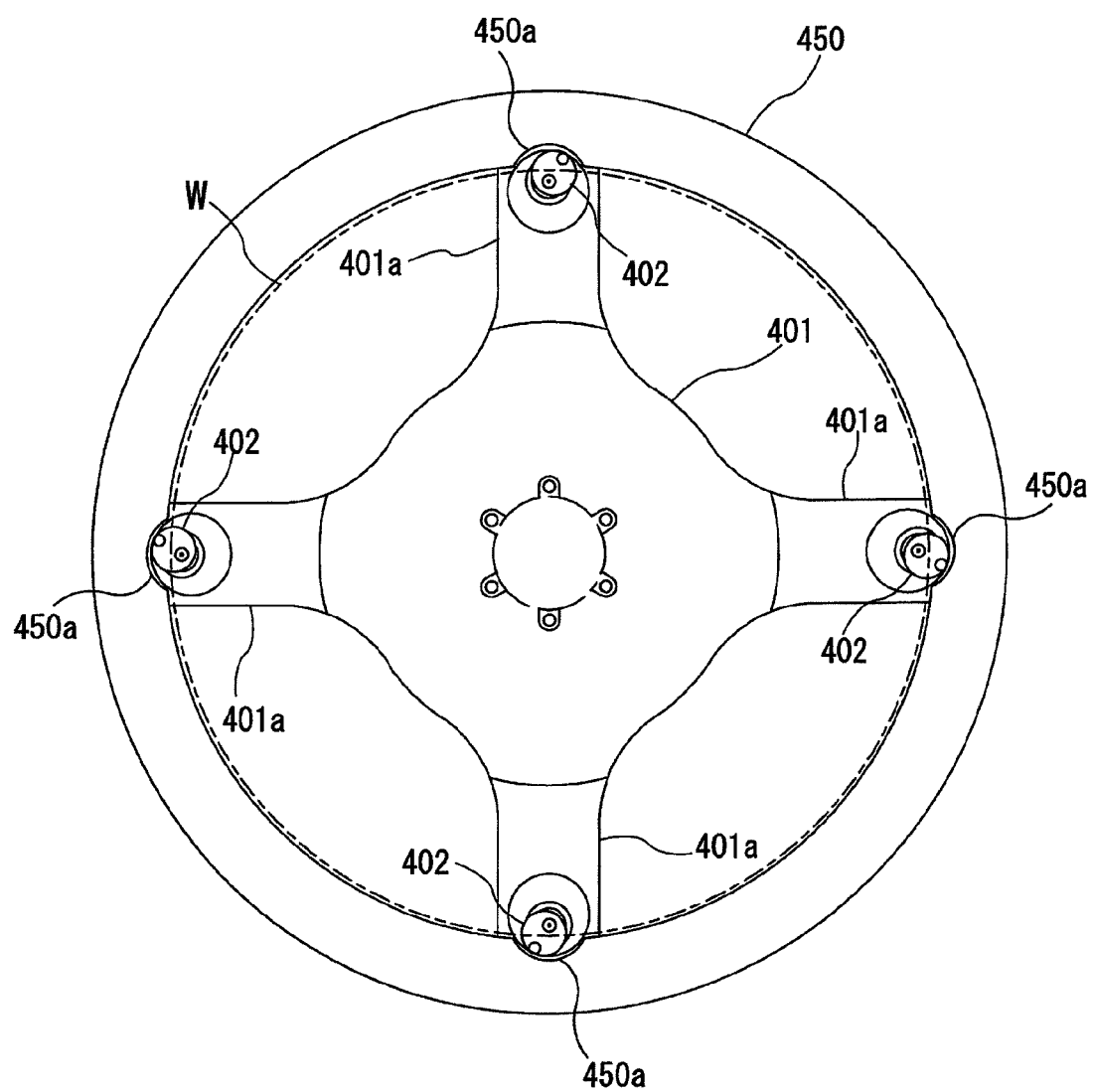
FIG. 11 is a plan view of the substrate processing unit of FIG. 10.

FIG. 10 is a vertical sectional view showing a substrate processing unit 400, which is used as a drying unit, according to another embodiment of the present invention, and FIG. 11 is a plan view of the substrate processing unit of FIG. 10. The drying unit (substrate processing unit) 400 of this embodiment includes a base 401 and four cylindrical substrate-support members 402 which are supported by the base 401. The base 401 is secured to an upper end of a rotational shaft 405, which is rotatably supported by bearings 406. These bearings 406 are secured to an inner surface of a cylindrical member 407 which is in parallel with the rotational shaft 405. A lower end of the cylindrical member 407 is mounted on a mount base 409 and is fixed in position. The rotational shaft 405 is coupled to a motor 415 via pulleys 411, 412 and a belt 414, so that the base 401 is rotated about its own axis by driving the motor 415.

The spin cover 450 is secured to an upper surface of the base 401. FIG. 10 shows a vertical cross section of the spin cover 450. The spin cover 450 is arranged so as to surround the substrate W. The spin cover 450 has the vertical cross section that is inclined radially inwardly and has a smooth curve. An upper end of the spin cover 450 lies in close proximity to the substrate W, and an inside diameter of the upper end of the spin cover 450 is slightly larger than the diameter of the substrate W. The upper end of the spin cover 450 has notches 450a each shaped along the circumferential surface of the substrate-support member 402. The notches 450a are located in positions corresponding to the substrate-support members 402. Drain holes 451, which extend obliquely, are formed in a bottom of the spin cover 450.

A front nozzle 454 for supplying pure water as a cleaning liquid onto the surface (front surface) of the substrate W is arranged above the substrate W. The front nozzle 454 is oriented toward the center of the substrate W. The front nozzle 454 is coupled to a pure water supply source (i.e., a cleaning liquid supply source), not shown in the drawings, and supplies the pure water to the center of the front surface of the substrate W. Other than pure water, a liquid chemical may be used as the cleaning liquid. Two parallel fluid nozzles 460, 461 for performing Rotagoni drying are disposed above the substrate W. The fluid nozzle 460 is used for supplying an IPA vapor (a mixture of isopropyl alcohol and an $N_2$ gas) onto the front surface of the substrate W. The fluid nozzle 461 is used for supplying pure water onto the front surface of the substrate W in order to prevent the front surface of the substrate W from being dried.

These fluid nozzles 460, 461 are mounted to a free end (front end) of a swing arm 500 which is coupled to an upper end of a support shaft 500, disposed beside the base 401, and swings by the rotation of the support shaft 500. The support shaft 500 is connected to a motor 504 as a drive mechanism for rotating the support shaft 500, thereby swinging the swing arm 502 on the support shaft 500. The rotational speed of the motor 504 is controlled by a signal from the control section 504, whereby the angular velocity of the swing arm 502 and thus the movement speed of the fluid nozzles 460, 461 are controlled.

The rotational shaft 405 houses therein a back nozzle 463 coupled to a cleaning-liquid supply source 465 and a gas nozzle 464 coupled to a drying-gas supply source 466. The cleaning-liquid supply source 465 stores pure water as a cleaning liquid therein and supplies the pure water through the back nozzle 463 to a rear surface of the substrate W. The drying-gas supply source 466 stores an $N_2$ gas or dry air as a drying gas therein, and supplies the drying gas through the gas nozzle 464 to the rear surface of the substrate W.

A lifting mechanism 470 for elevating the substrate-support members 402 is provided around the cylindrical member 407. This lifting mechanism 470 is configured to be able to slide in the vertical direction relative to the cylindrical member 407. The lifting mechanism 470 includes contact plates 470a arranged to be brought into contact with lower ends of the substrate-support members 402. A first gas chamber 471 and a second gas chamber 472 are formed between an outer circumferential surface of the cylindrical member 407 and an inner circumferential surface of the lifting mechanism 470. The first gas chamber 471 and the second gas chamber 472 are in fluid communication with a first gas passage 474 and a second gas passage 475, respectively. The first gas passage 474 and the second gas passage 475 have their ends which are coupled to a pressurized-gas supply source (not shown in the drawing). When pressure in the first gas chamber 471 is increased higher than pressure in the second gas chamber 472, the lifting mechanism 470 is elevated. On the other hand, when pressure in the second gas chamber 472 is increased higher than pressure in the first gas chamber 471, the lifting mechanism 470 is lowered. In FIG. 10, the lifting mechanism 470 is in the lowered position.

Figure 12:
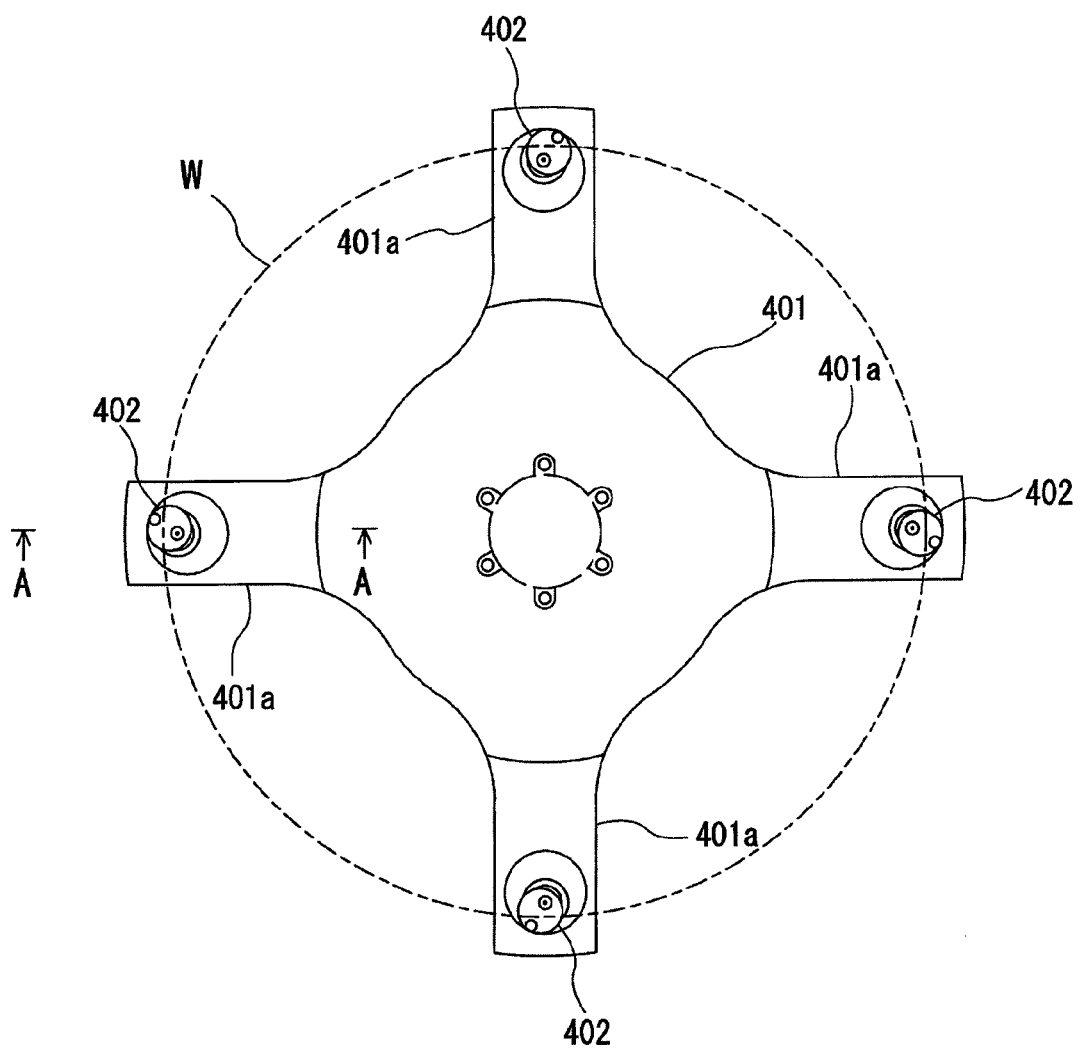
FIG. 12 is a plan view of a base shown in FIG. 10.
Figure 13A:
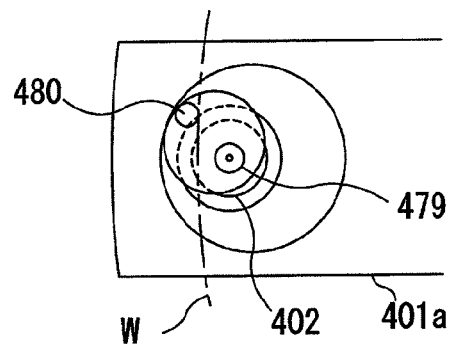
FIG. 13A is a plan view showing part of the substrate-support member and the base shown in FIG. 12.
Figure 13B:
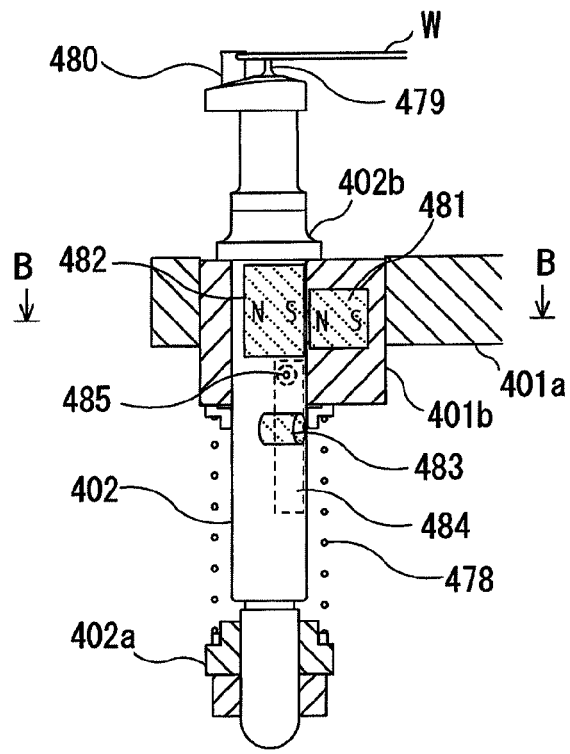
FIG. 13B is a cross-sectional view taken along line A-A of FIG. 12.
Figure 13C:
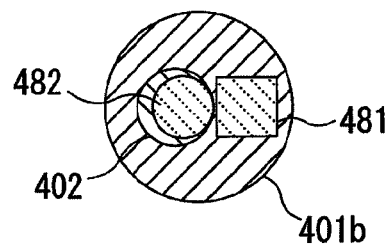
FIG. 13C is a cross-sectional view taken along line B-B of FIG. 13B.

FIG. 12 is a plan view of the base 401 shown in FIG. 10. As shown in FIG. 12, the base 401 includes four arms 401a and the substrate-support members 402 are vertically movably supported by tip ends of the arms 401a. FIG. 13A is a plan view showing part of the substrate-support member 402 and the base 401 shown in FIG. 12, FIG. 13B is a cross-sectional view taken along line A-A of FIG. 12, and FIG. 13C is a cross-sectional view taken along line B-B of FIG. 13B. The arm 401a of the base 401 has a holder 401b configured to slidably hold the substrate-support member 402. This holder 401b may be formed integrally with the arm 401a. A vertically-extending through-hole is formed in the holder 401b, and the substrate-support member 402 is inserted in this through-hole. The through-hole has a diameter slightly larger than a diameter of the substrate-support member 402. Therefore, the substrate-support member 402 is movable in the vertical direction relative to the base 401, and the substrate-support member 402 is rotatable about its own axis.

A spring support 402a is attached to a lower portion of the substrate-support member 402. A spring 478 is disposed around the substrate-support member 402, and the spring 478 is supported by the spring support 402a. An upper end of the spring 478 presses the holder 401b (which is part of the base 401). Therefore, the spring 478 exerts a downward force on the substrate-support member 402. A stopper 402b is formed on a circumferential surface of the substrate-support member 402. This stopper 402b has a diameter larger than the diameter of the through-hole. Therefore, a downward movement of the substrate-support member 402 is limited by the stopper 402b, as shown in FIG. 13B.

A support pin 479, on which the substrate W is to be placed, and a cylindrical clamp 480 as a substrate holding portion to be brought into contact with the periphery of the substrate W are provided on an upper end of the substrate-support member 402. The support pin 479 is arranged on the axis of the substrate-support member 402. On the other hand, the clamp 480 is arranged away from the axis of the substrate-support member 402. Therefore, as the substrate-support member 402 rotates, the clamp 480 makes revolutions around the axis of the substrate-support member 402. In order to prevent electrostatic charge, wafer-contacting portions are preferably made from a conductive material (preferably iron, aluminum, SUS) or carbon resin (e.g., PEEK or PVC).

A first magnet 481 is attached to the holder 401b of the base 401 so as to face a side surface of the substrate-support member 402. On the other hand, a second magnet 482 and a third magnet 483 are provided in the substrate-support member 402. The second magnet 482 and the third magnet 483 are arranged away from each other in the vertical direction. Neodymium magnet is preferably used as the first, second, and third magnets 481, 482, and 483.

Figure 14:
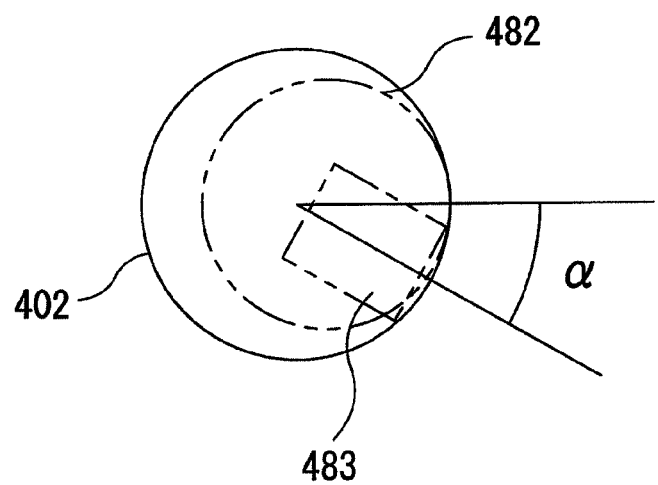
FIG. 14 is a schematic view showing an arrangement of a second magnet and a third magnet 483, as viewed from the axial direction of the substrate-support member.

FIG. 14 is a schematic view showing an arrangement of the second magnet 482 and the third magnet 483, as viewed from the axial direction of the substrate-support member 402. As shown in FIG. 14, the second magnet 482 and the third magnet 483 are arranged in different positions with respect to the circumferential direction of the substrate-support member 402. Specifically, a line connecting the second magnet 482 and the center of the substrate-support member 402 and a line connecting the third magnet 483 and the center of the substrate-support member 402 cross at a predetermined angle of α.

When the substrate-support member 402 is in the lowered position as shown in FIG. 13B, the first magnet 481 and the second magnet 482 face each other. At this time, an attractive force acts between the first magnet 481 and the second magnet 482. This attractive force generates a force of rotating the substrate-support member 402 about its own axis in a direction such that the clamp 480 presses the periphery of the substrate W. Accordingly, the lowered position shown in FIG. 13B is a clamp position in which the substrate W is held (clamped).

It is not necessary that the first magnet 481 and the second magnet 482 always face each other when holding the substrate W, as long as they are close enough to produce a sufficient holding force. For example, even when the first magnet 481 and the second magnet 482 tilt with respect to each other, the magnet force is produced between these magnets, as long as they are close to each other. Therefore, it is not necessary that the first magnet 481 and the second magnet 482 always face each other when holding the substrate W, as long as the magnet force is large enough to rotate the substrate-support member 402 to hold the substrate W.

Figure 15A:
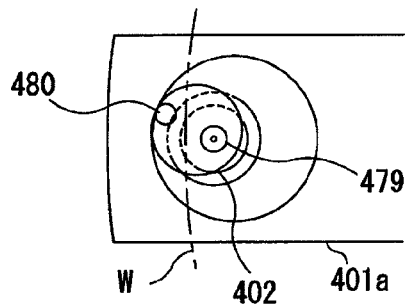
FIG. 15A is a plan view showing part of the substrate-support member and the arm when the substrate-support member is elevated by the lifting mechanism.
Figure 15B:
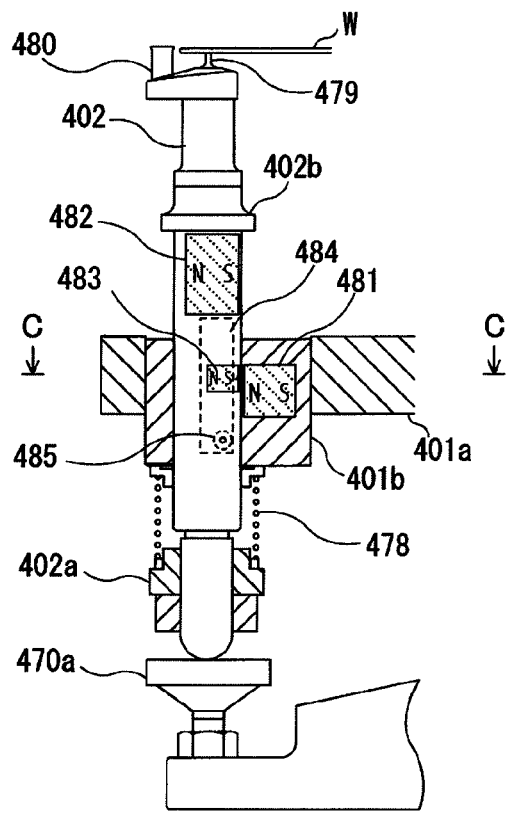
FIG. 15B is a cross-sectional view taken along line A-A of FIG. 12 when the substrate-support member is elevated by the lifting mechanism.
Figure 15C:
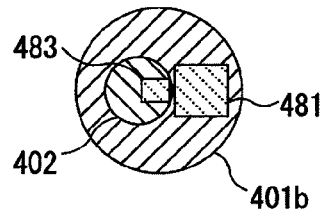
FIG. 15C is a cross-sectional view taken along line C-C of FIG. 15B.

FIG. 15A is a plan view showing part of the substrate-support member 402 and the arm 401a when the substrate-support member 402 is elevated by the lifting mechanism 470, FIG. 15B is a cross-sectional view taken along line A-A of FIG. 12 when the substrate-support member 402 is elevated by the lifting mechanism 470, and FIG. 15C is a cross-sectional view taken along line C-C of FIG. 15B.

When the substrate-support member 402 is elevated by the lifting mechanism 470 to the elevated position as shown in FIG. 15B, the first magnet 481 and the third magnet 483 face each other, and the second magnet 482 is away from the first magnet 481. At this time, an attractive force acts between the first magnet 481 and the third magnet 483. This attractive force generates a force of rotating the substrate-support member 402 about its own axis in a direction such that the clamp 480 moves away from the substrate W. Accordingly, the elevated position shown in FIG. 15B is an unclamp position in which the substrate W is released (unclamped). In this case also, it is not necessary that the first magnet 481 and the third magnet 483 always face each other when releasing the substrate W, as long as they are close enough to produce a sufficient force (magnet force) of rotating the substrate-support member 402 in a direction such that the clamp 480 is moved away from the substrate W.

Because the second magnet 482 and the third magnet 483 are arranged in different positions with respect to the circumferential direction of the substrate-support member 402, the rotating force acts on the substrate-support member 402 as the substrate-support member 402 moves up and down. This rotating force provides the clamp 480 with a force of holding the substrate W and a force of releasing the substrate W. Therefore, just by moving the substrate-support member 402 vertically, the clamp 480 can hold and release the substrate W. In this manner, the first magnet 481, the second magnet 482, and the third magnet 483 functions as a holding mechanism (rotating mechanism) for rotating the substrate-support member 402 about its own axis to cause the clamp 480 to hold the substrate W. This holding mechanism (rotating mechanism) is operated by the vertical movements of the substrate-support member 402.

The contact plates 470a of the lifting mechanism 470 are located below the substrate-support members 402. When the contact plates 470a move upward, upper surfaces of the contact plates 470a are brought into contact with the lower ends of the substrate-support members 402, and the substrate-support members 402 are elevated by the contact plates 470a against the pressing forces of the springs 478. The upper surface of each contact plate 470a is a flat surface, and on the other hand, the lower end of each substrate-support member 402 is in the shape of hemisphere. In this embodiment, the lifting mechanism 470 and the springs 478 constitute a drive mechanism for moving the substrate-support members 402 in the vertical direction. It is to be noted that the drive mechanism is not limited to this embodiment. For example, a servomotor may be used as the drive mechanism.

A groove 484 is formed on the side surface of each substrate-support member 402. This groove 484 extends along the axis of the substrate-support member 402, and has an arc-shaped horizontal cross section. A protrusion 485 projecting toward the groove 484 is formed on the arm 401a (the holder 401b in this embodiment) of the base 401. A tip end of this protrusion 485 lies in the groove 484, and the protrusion 485 roughly engages the groove 484. The groove 484 and the protrusion 485 are provided for limiting a rotation angle of the substrate-support member 402.

Next, operations of the drying unit (substrate processing unit) 400 with the above-described structures will be described.

First, the substrate W and the spin cover 450 are rotated in unison by the motor 415. In this state, the front nozzle 454 and the back nozzle 463 supply the pure water onto the front surface (upper surface) and the rear surface (lower surface) of the substrate W so as to rinse the substrate W in its entirety with the pure water. The pure water, supplied to the substrate W, spreads over the front surface and the rear surface via the centrifugal force, thereby rinsing the entire surfaces of the substrate W. The pure water, which is spun off from the rotating substrate W, is captured by the spin cover 450 and flows into the drain holes 451. When the substrate W is rinsed, the two fluid nozzles 460, 461 are in their given idle positions away from the substrate W.

Then, supply of the pure water from the front nozzle 454 is stopped, and the front nozzle 454 is moved to its given idle position away from the substrate W. The two fluid nozzles 460, 461 are moved to the offset position (cleaning start position) above the substrate W. While the substrate W is being rotated at a low speed ranging from 30 to 150 min$^{-1}$, the fluid nozzle 460 supplies the IPA vapor and the fluid nozzle 461 supplies the pure water onto the front surface of the substrate W. During this operation, the back nozzle 463 supplies the pure water to the rear surface of the substrate W.

As with the swing arm 44 of the above-described second cleaning unit (substrate processing unit) 18, the rotational speed of the motor 504 is controlled by the control section 504, whereby the angular velocity of the swing arm 502 and thus the movement speed of the two fluid nozzles 460, 461 are controlled, and the two fluid nozzle 460, 461 are simultaneously moved along a radial direction of the substrate W to a position lying outside the substrate W. In this manner, the front surface (upper surface) of the substrate W is dried.

Thereafter, the two fluid nozzles 460, 461 are moved to the their idle positions, and supply of the pure water from the back nozzle 463 is stopped. Then, the substrate W is rotated at a high speed ranging from 1000 to 1500 min$^{-1}$, thereby removing the pure water from the rear surface of the substrate W. During this operation, the gas nozzle 464 supplies the drying gas to the rear surface of the substrate W. In this manner, the rear surface of the substrate W is dried.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims and equivalents.

What is claimed is:

1. A substrate processing method of processing a surface of a substrate by moving a fluid nozzle while jetting a single fluid or a plurality of fluids from the fluid nozzle toward the surface of the rotating substrate, the substrate processing method comprising:

determining a first time required for the fluid nozzle to move from a processing start position on the surface of the substrate to a processing end position;

determining a length of movement of the fluid nozzle which moves along at least a part of an entire movement path from the processing start position to the processing end position, at a movement speed V(r) which satisfies a relational expression $V(r) \times r^\alpha = C$ (constant), where V(r) represents the movement speed of the fluid nozzle when the fluid nozzle passes through a position corresponding to a position on the surface of the substrate at a distance r from a center of the substrate, and $\alpha$ represents a power index;

obtaining the power index a from the first time by a predetermined relational equation which represents a relation between the first time and the power index $\alpha$;

calculating the movement speed V(r) of the fluid nozzle which satisfies the relational expression $V(r) \times r^\alpha = C$ (constant), wherein $\alpha$ represents the power index obtained from the predetermined relational equation; and processing the surface of the substrate by moving the fluid nozzle at the calculated movement speed V(r) while jetting a single fluid or a plurality of fluids from the fluid nozzle toward the surface of the substrate as the substrate rotates.

2. The substrate processing method according to claim 1, wherein the processing comprises moving the fluid nozzle from the processing start position to a predetermined position through a position corresponding to the center of the substrate at a constant movement speed, and then moving the fluid nozzle outward from the predetermined position over the length of movement at the movement speed V(r), the processing start position being located on an opposite side of a range of the length of movement with respect to the position corresponding to the center of the substrate.

3. The substrate processing method according to claim 1, wherein a distance between the processing start position and the position corresponding to the center of the substrate is equal to or less than a distance between the predetermined position and the position corresponding to the center of the substrate.

4. The substrate processing method according to claim 1, wherein the power index α is in a range of 0<α<1.

5. The substrate processing method according to claim 1, wherein the predetermined equation which expresses a relation between the first time and the power index α is the following equation:

$$V_0 = \frac{1}{t}\left[h + b + \frac{1}{(\alpha+1)b^\alpha}(R^{\alpha+1} - b^{\alpha+1})\right]$$

wherein $V_o$ represents an initial movement speed of the fluid nozzle; h represents a distance between the processing start position and the center of the substrate; b represents a distance from the center of the substrate to the predetermined position; R represents a distance from the center of the substrate to the processing end position; and t represents the first time required for the fluid nozzle to move from the processing start position to the processing end position.

6. The substrate processing method according to claim 1, wherein the fluid is pure water.

7. The substrate processing method according to claim 1, wherein the fluid nozzle jets a two-fluid jet flow toward the surface of the substrate.

8. The substrate processing method according to claim 1, wherein the fluid is isopropyl alcohol vapor.

9. The substrate processing method according to claim 1, wherein the determining the first time comprises inputting a value of the first time into a control section, and the determining the length of movement of the fluid nozzle comprises inputting a value of the length of movement into the control section.

10. A method of controlling a movement speed of a fluid nozzle, the fluid nozzle being configured to jet a single fluid or a plurality of fluids toward a surface of the rotating substrate to process the surface of the substrate, the method comprising:
    determining a first time required for the fluid nozzle to move from a processing start position on the surface of the substrate to a processing end position;
    determining a length of movement of the fluid nozzle which moves along at least a part of an entire movement path from the processing start position to the processing end position, at a movement speed V(r) which satisfies a relational expression V(r)×r$^\alpha$=C (constant), where V(r) represents the movement speed of the fluid nozzle when the fluid nozzle passes through a position corresponding to a position on the surface of the substrate at a distance "r" from a center of the substrate, and α represents a power index;
    obtaining the power index α from the first time by a predetermined relational equation which represents a relation between the first time and the power index α;
    calculating the movement speed V(r) of the fluid nozzle which satisfies the relational expression V(r)×r$^\alpha$=C (constant), where α represents the power index obtained from the predetermined relational equation; and
    moving the fluid nozzle while controlling the movement speed of the fluid nozzle based on the calculated movement speed V(r) of the fluid nozzle.

11. The method for controlling a movement speed of a fluid nozzle according to claim 10, wherein the moving comprises moving the fluid nozzle from the processing start position to a predetermined position through a position corresponding to the center of the substrate at a constant movement speed, and then moving the fluid nozzle outward from the predetermined position over the length of movement at the movement speed V(r), the processing start position being located on an opposite side of a range of the length of movement with respect to the position corresponding to the center of the substrate.

12. The method for controlling a movement speed of a fluid nozzle according to claim 10, wherein a distance between the processing start position and the position corresponding to the center of the substrate is equal to or less than a distance between the predetermined position and the position corresponding to the center of the substrate.

13. The method for controlling a movement speed of a fluid nozzle according to claim 10, wherein the determining the first time comprises inputting a value of the first time into a control section, and the determining the length of movement of the fluid nozzle comprises inputting a value of the length of movement into the control section.

14. A substrate processing method of processing a surface of a substrate by moving a fluid nozzle while jetting a single fluid or a plurality of fluids from the fluid nozzle toward the surface of the rotating substrate, the substrate processing method comprising:
    determining a length of movement of the fluid nozzle which moves along a movement path, at a movement speed V(r) which satisfies a relational expression V(r)× r$^\alpha$=C (constant), where V(r) represents the movement speed of the fluid nozzle when the fluid nozzle passes through a position corresponding to a position on the surface of the substrate at a distance "r" from a center of the substrate, and α represents a power index;
    determining a time required for the fluid nozzle to move over the determined length of movement;
    obtaining the power index a from the determined time by a predetermined relational equation which represents a relation between the determined time and the power index α;
    calculating the movement speed V(r) of the fluid nozzle which satisfies the relational expression V(r)×r$^\alpha$=C (constant), where α represents the power index obtained from the predetermined relational equation; and
    processing the surface of the substrate by moving the fluid nozzle at the calculated movement speed V(r) while jetting a single fluid or a plurality of fluids from the fluid nozzle toward the surface of the substrate as the substrate rotates.

15. The substrate processing method according to claim 14, wherein the processing comprises moving the fluid nozzle from a processing start position to a predetermined position through a position corresponding to the center of the substrate at a constant movement speed, and then moving the fluid nozzle outward from the predetermined position over the length of movement at the movement speed V(r), the processing start position being located on an opposite side of a range of the length of movement with respect to the position corresponding to the center of the substrate.

16. The substrate processing method according to claim 14, wherein a distance between the processing start position and the position corresponding to the center of the substrate is equal to or less than a distance between the predetermined position and the position corresponding to the center of the substrate.

17. The substrate processing method according to claim 14, wherein the determining the time comprises inputting a value of the time into a control section, and the determining the length of movement of the fluid nozzle comprises inputting a value of the length of movement into the control section.

18. A method of controlling a movement speed of a fluid nozzle, the fluid nozzle being configured to jet a single fluid or a plurality of fluids toward a surface of the rotating substrate and to process the surface of the substrate, the method comprising:

determining a length of movement of the fluid nozzle which moves along a movement path, at a movement speed V(r) which satisfies a relational expression V(r)× $r^\alpha$=C (constant), wherein V(r) represents the movement speed of the fluid nozzle when the fluid nozzle passes through a position corresponding to a position on the surface of the substrate at a distance r from a center of the substrate, and α represents a power index;

determining a time required for the fluid nozzle to move over the determined length of movement;

obtaining the power index α from the determined time by a predetermined relational equation which represents a relation between the determined time and the power index α;

calculating the movement speed V(r) of the fluid nozzle which satisfies the relational expression V(r)×$r^\alpha$=C (constant), where α represents the power index obtained from the predetermined relational equation; and moving the fluid nozzle while controlling the movement speed of the fluid nozzle based on the calculated movement speed V(r) of the fluid nozzle.

19. The method for controlling a movement speed of a fluid nozzle according to claim 18, wherein the moving comprises moving the fluid nozzle from a processing start position to a predetermined position through a position corresponding to the center of the substrate at a constant movement speed, and then moving the fluid nozzle outward from the predetermined position over the length of movement at the movement speed V(r), the processing start position being located on an opposite side of a range of the length of movement with respect to the position corresponding to the center of the substrate.

20. The method for controlling a movement speed of a fluid nozzle according to claim 18, wherein a distance between the processing start position and the position corresponding to the center of the substrate is equal to or less than a distance between the predetermined position and the position corresponding to the center of the substrate.

21. The method for controlling a movement speed of a fluid nozzle according to claim 18, wherein the determining the time comprises inputting a value of the time into a control section, and the determining the length of movement of the fluid nozzle comprises inputting a value of the length of movement into the control section.

* * * * *